(12) United States Patent
Stokes et al.

(10) Patent No.: US 7,656,253 B2
(45) Date of Patent: Feb. 2, 2010

(54) SURFACE ACOUSTIC WAVE PASSBAND CONTROL

(75) Inventors: Robert Bruce Stokes, Rancho Palos Verdes, CA (US); Alvin Ming-Wei Kong, Manhattan Beach, CA (US)

(73) Assignee: Northrop Grumman Space & Mission Systems Corporation, Los Angeles, CA (US)

( * ) Notice: Subject to any disclaimer, the term of this patent is extended or adjusted under 35 U.S.C. 154(b) by 252 days.

(21) Appl. No.: 11/788,081

(22) Filed: Apr. 18, 2007

(65) Prior Publication Data

US 2008/0258843 A1  Oct. 23, 2008

(51) Int. Cl.
*H03H 9/00* (2006.01)
*H03H 9/145* (2006.01)

(52) U.S. Cl. ...................... 333/193; 333/188
(58) Field of Classification Search ................. 333/133, 333/187, 188, 189, 191, 192, 193
See application file for complete search history.

(56) References Cited

U.S. PATENT DOCUMENTS

| | | | | |
|---|---|---|---|---|
| 3,813,618 | A | * | 5/1974 | Hartemann et al. .......... 333/193 |
| 4,124,828 | A | * | 11/1978 | Bert .......................... 333/153 |
| 4,207,545 | A | * | 6/1980 | Grudkowski et al. ........ 333/150 |
| 4,233,573 | A | | 11/1980 | Grudkowski |
| 4,354,166 | A | | 10/1982 | Grudkowski |
| 4,401,956 | A | | 8/1983 | Joshi |
| 4,748,364 | A | * | 5/1988 | Mitsutsuka ............. 310/313 D |
| 5,329,256 | A | | 7/1994 | Higgins, Jr. |
| 5,343,175 | A | | 8/1994 | Davenport |
| 5,365,207 | A | | 11/1994 | Borras |
| 5,426,340 | A | | 6/1995 | Higaki et al. |
| 5,757,250 | A | | 5/1998 | Ichikawa |
| 5,959,388 | A | | 9/1999 | Graebner |
| 6,049,155 | A | | 4/2000 | Graebner |

(Continued)

OTHER PUBLICATIONS

A.C. Anderson et al.; Attentuating Thin Films for Saw Devices; Ultrasonics Symposium; 1980; pp. 442-445; Lincoln Laboratory, Massachusetts Institute of Technology Lexington, Massachusetts, US.

*Primary Examiner*—Dean O Takaoka
(74) *Attorney, Agent, or Firm*—Carmen Patti Law Group, LLC

(57) ABSTRACT

An apparatus in one example comprises a piezoelectric layer, an input transducer, an output transducer, and at least one electrode set. The input transducer is configured to convert an input signal from an input source to a surface acoustic wave and send the surface acoustic wave from an input portion of the piezoelectric layer to an output portion of the piezoelectric layer. The input transducer comprises a set of input passbands. The output transducer is configured to receive the surface acoustic wave from the output portion of the piezoelectric layer. The output transducer comprises a set of output passbands. The at least one electrode set is configured to apply at least one voltage bias to at least one portion of the piezoelectric layer to create an electric field that controls an acoustic velocity of the surface acoustic wave through the at least one portion of the piezoelectric layer. The at least one electrode set is configured to control one or more of the set of input passbands and the set of output passbands by adjustment of the at least one voltage bias.

39 Claims, 9 Drawing Sheets

U.S. PATENT DOCUMENTS

| | | |
|---|---|---|
| 6,285,865 B1 | 9/2001 | Vorenkamp |
| 6,426,680 B1 | 7/2002 | Duncan |
| 6,541,893 B2 | 4/2003 | Zhu |
| 6,549,766 B2 | 4/2003 | Vorenkamp |
| 6,559,736 B2 | 5/2003 | Lu |
| 6,621,192 B2 | 9/2003 | Lu |
| 6,664,871 B2 | 12/2003 | Yip |
| 6,710,515 B2 | 3/2004 | Lu |
| 6,803,829 B2 | 10/2004 | Duncan |
| 2008/0042517 A1 | 2/2008 | Stokes et al. |

* cited by examiner

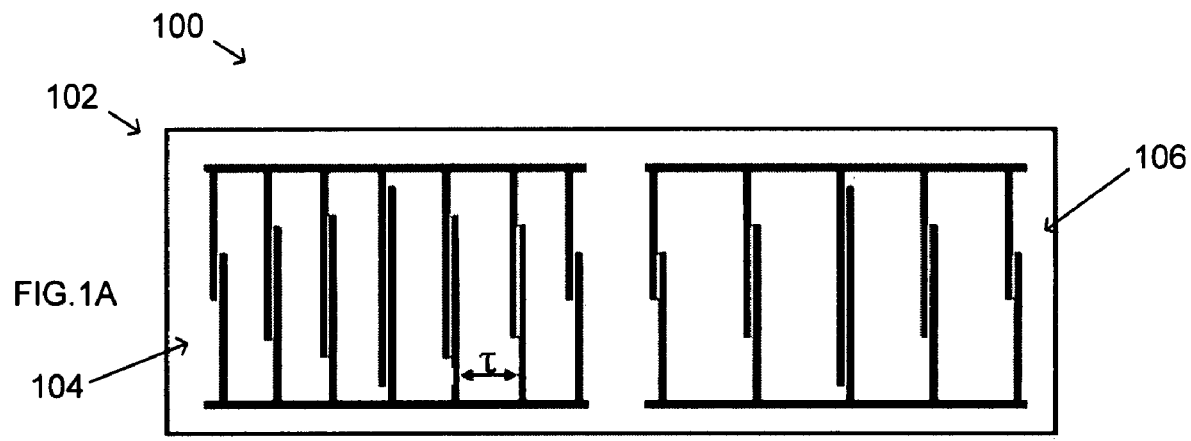
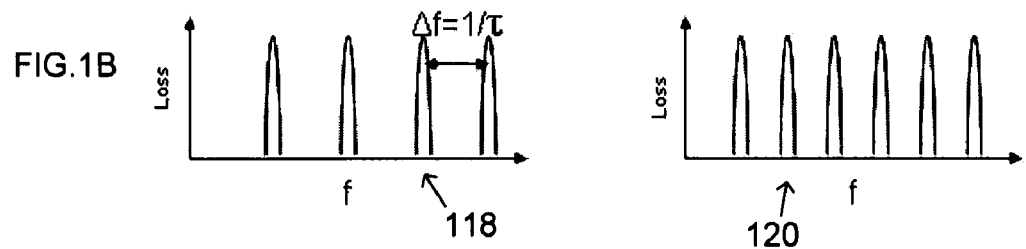
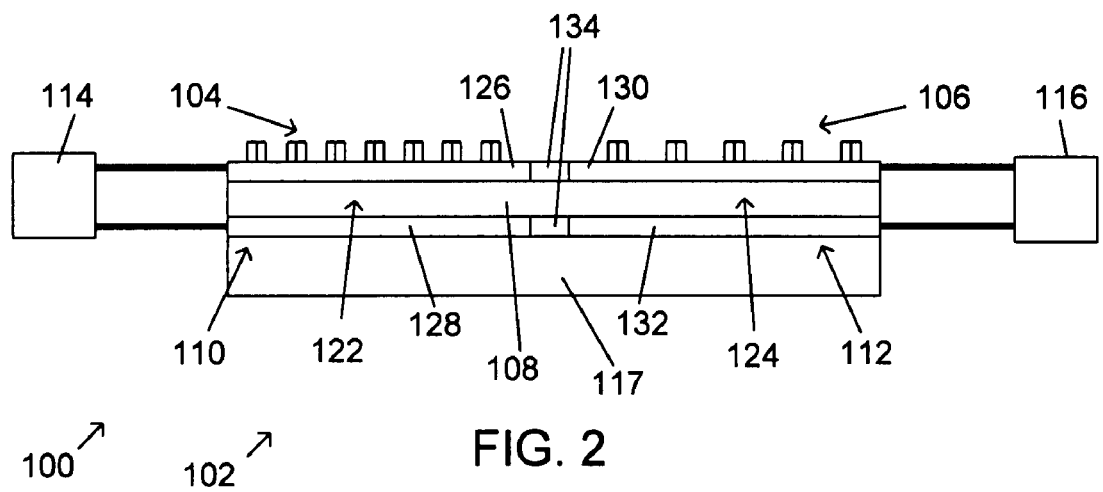
FIG. 2

SURFACE ACOUSTIC WAVE PASSBAND CONTROL

CROSS-REFERENCE TO RELATED APPLICATIONS

This application contains subject matter that is related to the subject matter of the following applications, which are assigned to the same assignee as this application. The below-listed applications are hereby incorporated herein by reference in their entireties:

"ELECTRIC FIELD CONTROL OF SURFACE ACOUSTIC WAVE VELOCITY," by Stokes et al., application Ser. No. 11/504,372, filed Aug. 15, 2006.

TECHNICAL FIELD

The invention relates generally to surface acoustic wave devices and more particularly to surface acoustic wave filters.

BACKGROUND

Conventional surface acoustic wave (SAW) filters can provide excellent filter characteristics, but have fixed properties set in the design and fabrication. Electrically tuned filters are often needed. For example, a preselector filter may be needed in a receiver prior to amplification and/or frequency conversion, in order to suppress strong unwanted signals that could result in multiple spurious signals from mixing in nonlinear devices. Or, a filter could be needed in a frequency synthesizer to select any one of many continuous RF tones on command. Or, it could be used in the feedback loop of an adjustable oscillator to provide the very low phase noise expected from a SAW-stabilized oscillator, but with tunability over frequency without the use of the commonly used varactor, which degrades phase noise.

Electrically adjustable SAWs have been previously built and demonstrated with discrete electronic switching of individual fingers or finger groups in the SAW transducers. However, the filter properties are usually crude in terms of passband shape control and are not continuously tunable.

Thus, a need exists for passband control of a surface acoustic wave.

SUMMARY

The invention in one implementation encompasses an apparatus. The apparatus comprises a piezoelectric layer, an input transducer, an output transducer, and at least one electrode set. The input transducer is configured to convert an input signal from an input source to a surface acoustic wave and send the surface acoustic wave from an input portion of the piezoelectric layer to an output portion of the piezoelectric layer. The input transducer comprises a set of input passbands. The output transducer is configured to receive the surface acoustic wave from the output portion of the piezoelectric layer. The output transducer comprises a set of output passbands. The at least one electrode set is configured to apply at least one voltage bias to at least one portion of the piezoelectric layer to create an electric field that controls an acoustic velocity of the surface acoustic wave through the at least one portion of the piezoelectric layer. The at least one electrode set is configured to control one or more of the set of input passbands and the set of output passbands by adjustment of the at least one voltage bias.

Another implementation of the invention encompasses a method. A first voltage bias is applied to an input portion of a piezoelectric layer to create a first electric field in the input portion. The first electric field controls a velocity of a surface acoustic wave through the input portion. An input signal is introduced as a surface acoustic wave to the input portion and toward an output portion of the piezoelectric layer by an input transducer coupled with the input portion. The input transducer comprises a set of input passbands that are based on the velocity of the surface acoustic wave through the input portion. The input signal is attenuated by the input transducer if a frequency of the input signal is not within the set of input passbands. A second voltage bias is applied to the output portion to create a second electric field in the output portion. The second electric field controls the velocity of the surface acoustic wave through the output portion. The surface acoustic wave is converted to an output signal by an output transducer coupled with the output portion. The output transducer comprises a set of output passbands that are based on the velocity of the surface acoustic wave through the output portion. The output signal is attenuated by the output transducer if the frequency of the output signal is not within the set of output passbands.

DESCRIPTION OF THE DRAWINGS

Features of example implementations of the invention will become apparent from the description, the claims, and the accompanying drawings in which:

FIG. 1A is a representation of a top view of one implementation of an apparatus that comprises an input transducer and an output transducer.

FIG. 1B is a representation of a set of input passbands and a set of output passbands for the input transducer and the output transducer of the implementation of FIG. 1A.

FIG. 2 is a representation of a side view of the implementation of FIG. 1.

DETAILED DESCRIPTION

Figure 3:
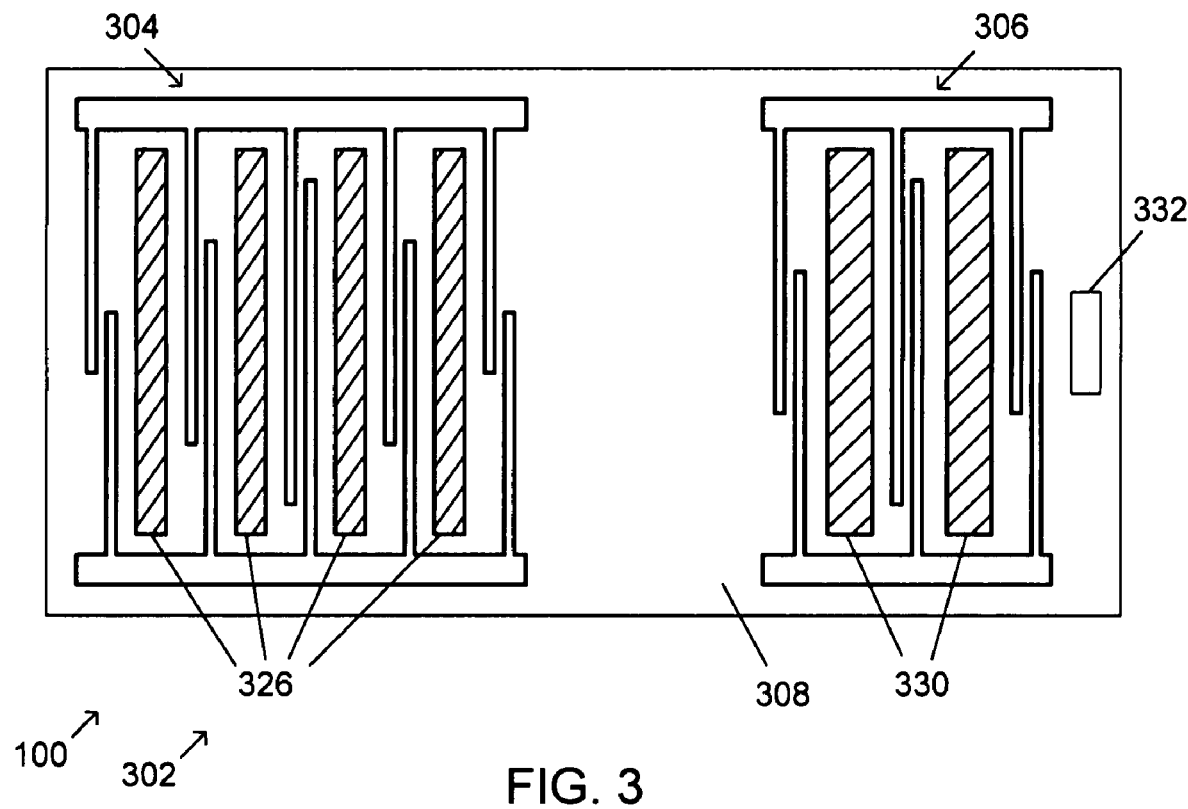
FIG. 3 is a representation of a top view of another implementation of the apparatus of FIG. 1A.

Turning to FIGS. 1 and 2, an apparatus 100 in one example comprises a surface acoustic wave (SAW) filter 102. The SAW filter 102 in one example comprises a voltage adjustable SAW filter, as described herein. The SAW filter 102 comprises an input transducer 104, an output transducer 106, a piezoelectric layer 108, a first electrode set 110, a second electrode set 112, a first voltage bias source 114, a second voltage bias source 116, and a substrate 117. The input transducer 104 and the output transducer 106 in one example comprise thinned electrode transducers. Each of the input and output transducers 104 and 106 in one example are composed of quarter-wavelength wide fingers, with alternating polarities, with finger width and gap spacing of one micrometer and a finger length of 400 micrometers. The fingers are arranged in finger groups. In the implementation of FIGS. 1 and 2, the input transducer 104 comprises seven finger groups and the output transducer 106 comprises five finger groups. Referring to FIGS. 1 and 2, each finger group comprises two fingers which originate on opposing sides of the transducer. In alternative implementations, the finger groups may comprise additional fingers that alternately originate from the opposing sides of the transducer, for example, five fingers per finger group.

During operation of the SAW filter 102, an electrical signal is applied to the input transducer 104 which causes a surface acoustic wave to propagate in the SAW filter 102. The output transducer 106 later converts the propagated acoustic wave into an output electrical signal, as will be appreciated by those skilled in the art. Referring to FIG. 1A, the finger groups are spaced across the transducers, separated center-to-center by a time delay $\tau$ for a baseline velocity. A time delay $\tau_{input}$ in the input transducer 104 is different than a time delay $\tau_{output}$ in the output transducer 106. Since the transducers only connect to the acoustic wave with these spaced finger groups, this is similar to sampling a signal with a sample every time $\tau$. This coarse sampling means that the transducer transmits and responds to a number of passbands, rather than just one passband.

The input transducer 104 and output transducer 106 in one example are configured to provide multiple passbands spaced by a same frequency. The passbands and spacing frequency in one example are based on a time or delay spacing of the finger groups. The input transducer 104 comprises a set of input passbands 118 and the output transducer 106 comprises a set of output passbands 120. For example, the transducer works with a phase of the acoustic wave at the sampling points, and is insensitive to the phase elsewhere. If the transducer is effective for a baseline frequency f at the baseline velocity, it is also effective for frequencies $f+/-n*(1/\tau)$, where n is an integer. Accordingly, the frequency spacing between the multiple passbands is $1/\tau$.

Referring to FIG. 1B, the finger groups in the output transducer 106 are spaced more distantly than the finger groups of the input transducer 104. Accordingly, the set of output passbands 120 are closer together than the set of input passbands 118. The transducers 104 and 106 in one example are designed such that only one particular passband in the input transducer 104 will line up in frequency with only one particular passband in the output transducer 106, causing the SAW filter 102 to pass only frequencies in a single desired passband.

The input transducer 104 is configured to cause the surface acoustic wave to propagate from an input portion 122 of the SAW filter 102, through the piezoelectric layer 108 and substrate 117, towards an output portion 124 of the SAW filter 102. The output transducer 106 is configured to receive the surface acoustic wave at the output portion 124 and convert the propagated acoustic wave into the output electrical signal.

The first electrode set 110 in one example is configured to apply a first voltage bias to the input portion 122 to create a first electric field in the input portion 122. The first electrode set 110 in one example comprises an upper electrode 126 and a lower electrode 128 that are configured to receive the first voltage bias from the first voltage bias source 114 to create the first electric field. The upper electrode 126 and lower electrode 128 provide a uniform electric field biasing of the input portion 122 of the piezoelectric layer 108. The first electric field is employable to control an acoustic velocity of a surface acoustic wave through the input portion 122, as the electric field perturbs the material properties of the piezoelectric layer 108 through the piezoelectric effect which in turn modifies the wave propagation physics, in one example resulting in an approximately linear relation between the electric field and the deviation from the unbiased (e.g., baseline) acoustic velocity. An increase in velocity of the acoustic wave will reduce the time delay between the finger groups. A decrease in velocity of the acoustic wave will increase the time delay. Since a change in the time delay will change the frequency spacing of the sets of passbands, the first electric field is therefore employable to tune the set of input passbands 118, as will be appreciated by those skilled in the art.

The second electrode set 112 is configured to apply a second voltage bias to the output portion 124 to create a second electric field in the output portion 124. The second electrode set 112 in one example comprises an upper electrode 130 and a lower electrode 132 that are configured to receive the second voltage bias from the second voltage bias source 116 to create the second electric field. The upper electrode 130 and lower electrode 132 provide a uniform electric field biasing of the output portion 124 of the piezoelectric layer 108. The second electric field is employable to control the acoustic velocity of the surface acoustic wave through the output portion 124. Accordingly, the second electric field is employable to tune the set of output passbands 120.

The first and second voltage biases are applied to the first and second electrode sets 110 and 112 to adjust the spacing of the sets of input and output passbands 118 and 120. When the voltage bias is set to zero, the velocity of the acoustic wave is equal to the baseline velocity. The velocity of the acoustic wave is greater than the baseline velocity for a first polarity of the piezoelectric layer and less than the baseline velocity for a second polarity of the piezoelectric layer 108 when the voltage bias is positive. The velocity of the acoustic wave is less than the baseline velocity for the first polarity of the piezoelectric layer 108 and greater than the baseline velocity for the second polarity when the first voltage bias is negative, as will be appreciated by those skilled in the art. As the velocity of the acoustic wave is increased, the spacing of the sets of passbands is increased and the frequency f is increased (i.e., upshifted). As the velocity of the acoustic wave is reduced, the spacing of the sets of passbands is reduced and the frequency f is reduced (i.e., downshifted).

The substrate 117 in one example serves to provide a surface for formation of thin single crystal films. For example, the substrate 117 supports the first electrode set 110, the second electrode set 112, and the piezoelectric layer 108. The lower electrodes 128 and 132 in one example are formed on the substrate 117. One or more intermediate layers in another example may be positioned between the substrate 117 and the lower electrodes 128 and 132 to facilitate growth of the lower electrodes 128 and 132 on the substrate 117, as will be appreciated by those skilled in the art. The substrate 117 in one example comprises a crystal with high acoustic velocity and low loss, such as a c-plane sapphire. In another example, the substrate 117 may comprise silicon carbide. The size of the substrate 117 may vary based on the selected material and/or the intended application. In one example, the substrate 117 comprises a 40 to 500 micrometer thick c-plane sapphire substrate layer.

The piezoelectric layer 108 is formed on top of the lower electrodes 128 and 132. In one example, the lower electrodes 128 and 132 are formed as a single electrode layer (328, FIG. 3) and comprise a same electrode, for example, a common ground. In another example (FIG. 2), one or more of the upper electrodes 126 and 130 and the lower electrodes 128 and 132 are separated by an insulator 134. The upper electrodes 126 and 130 are formed on top of the input portion 122 and output portion 124 of the piezoelectric layer 108, respectively. The input transducer 104 in one example is formed on top of the upper electrode 126 and the output transducer 106 is formed on top of the upper electrode 130. The top electrodes 126 and 130 in one example are maintained at a same average voltage as the transducers, so that the voltage potential across a top surface of the SAW filter 102 has an approximately uniform potential.

The input transducer 104 and output transducer 106 are both electrically tunable, using the piezoelectric layer biasing approach described above. The input transducer 104 and the output transducer 106 in one example are configured such that only one passband of the set of input passbands 118 will line up with one passband of the set of output passbands 120, so only one selected overall passband is passed by the SAW filter 102, and the frequency of the selected overall passband can be positioned over a wide band, for example up to 60% of the baseline frequency.

The tuning mechanism of the SAW filter 102 in one example is reminiscent of the way a Vernier scale works on a micrometer or a Vernier caliper-two scales with slightly different line spacing are etched on two pieces of metal which slide next to each other. A very tiny motion of one of the pieces of metal results in a large change in the position of the pair of lines which line up, so very small displacements can be easily read in a magnified way by the human eye. For the SAW filter 102, a relatively small tuning effect in the transducers is magnified into a large shift in the frequency of the selected overall filter passband.

Figure 4:
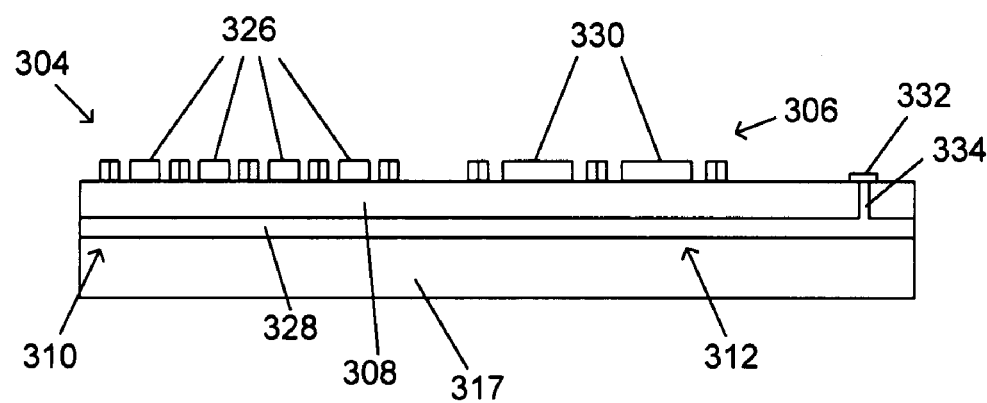
FIG. 4 is a representation of a side view of the implementation of FIG. 3.

Turning to FIGS. 3 and 4, another implementation of the apparatus 100 comprises a voltage adjustable SAW filter 302. The SAW filter 302 comprises an input transducer 304, an output transducer 306, a piezoelectric layer 308, a first electrode set 310, a second electrode set 312, and a substrate 317. In this implementation, the first and second electrode sets 310 and 312 comprise electrodes 326, 328, and 330. The electrode 328 shown in this implementation is shared between the first and second electrode sets 310 and 312. For example, the electrode 328 is formed as a single electrode layer. Other implementations may also be used, such as the implementation of electrodes 128 and 132 shown in FIG. 2. The piezoelectric layer 308 is formed over the electrode 328. Electrical contact to the electrode 328 may be made with an ohmic contact 332 and via 334, as will be appreciated by those skilled in the art.

In the implementation of FIGS. 3 and 4, the input transducer 304 and output transducer 306 are formed directly on the piezoelectric layer 308. The first electrode set 304 comprises upper electrodes 326 which are formed directly on the piezoelectric layer 308 and between the finger groups of the input transducer 304. The second electrode set 306 comprises upper electrodes 330 which are also formed directly on the piezoelectric layer 308 and between the finger groups of the output transducer 306. In this implementation, the upper electrodes 326 and 330 do not directly contact the input and output transducers 304 and 306. In one example, this simplifies the manufacture of the apparatus 100 and allows the use of a metal pad for the upper electrodes 326 and 330, as will be appreciated by those skilled in the art.

Figure 5:
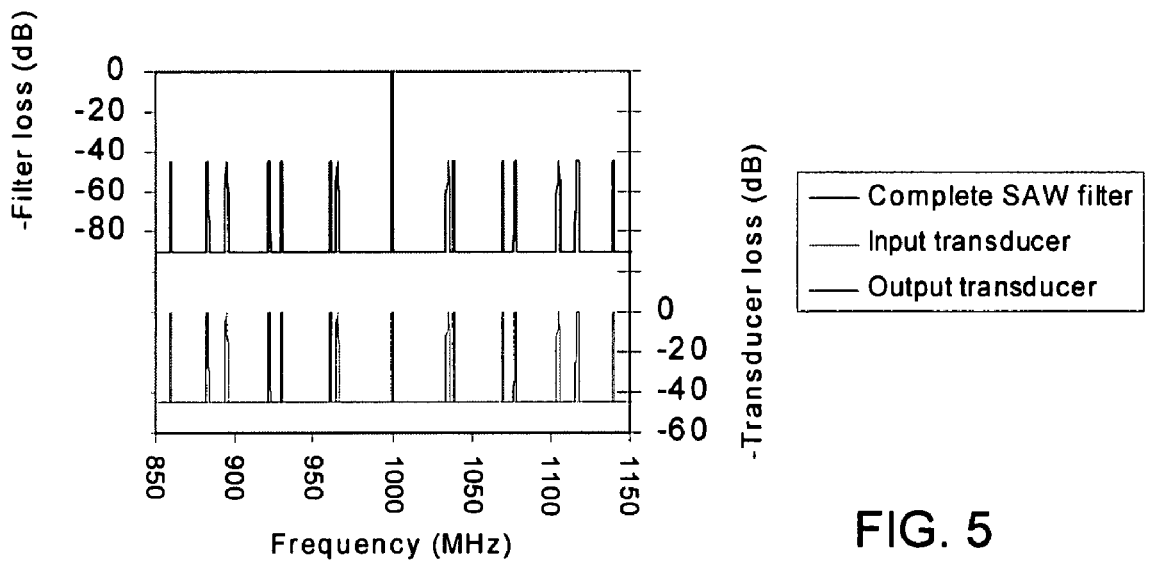
FIG. 5 is a representation of one example of the input passbands, output passbands, and an overall passband for the implementation of FIG. 1 tuned to 1000 MHz.

An illustrative description of operation of the apparatus 100 is presented, for explanatory purposes. Turning to FIG. 5, one implementation of the SAW filter 102 is designed to have a 1 MHz wide passband, and each transducer is designed to provide 45 dB rejection down of out-of-band signals at a point 1 MHz from the 1 MHz band center. The input transducer 104 has a spacing of 35 MHz between each passband in the set of input passbands 118, and the output transducer 106 has a spacing of 39 MHz between each passband in the set of output passbands 120, corresponding to finger group spacings in the input and output transducers 104 and 106 of 29 and 26 nanoseconds, respectively. FIG. 5 shows the set of input passbands 118 and output passbands 120 of the individual transducers on the bottom, and the overall response of the SAW filter 102 on the top, when the device is unbiased (i.e., the first and second voltage biases are zero). The set of input passbands 118 and the set of output passbands 120 overlap at only the center (e.g., baseline) frequency of 1000 MHz.

With a small amount of velocity tuning by voltage bias, for example, less than or equal to 2%, the SAW filter 102 can be adjusted to pass any other frequency in the range of 850-1150 MHz. In order to be set to any frequency, both the input transducer and output transducer are electrically tuned independently with two separate DC voltage biases, for example, the first and second voltage bias sources 114 and 116.

Figure 6:
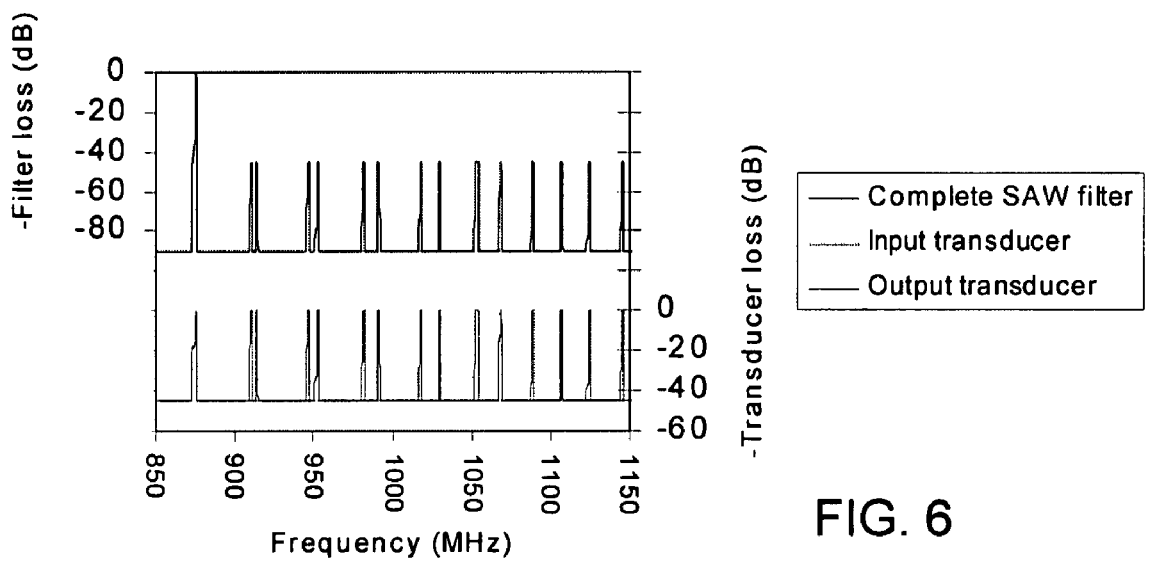
FIG. 6 is a representation of another example of the input passbands, output passbands, and overall passband for the implementation of FIG. 1 tuned to 875 MHz.
Figure 7:
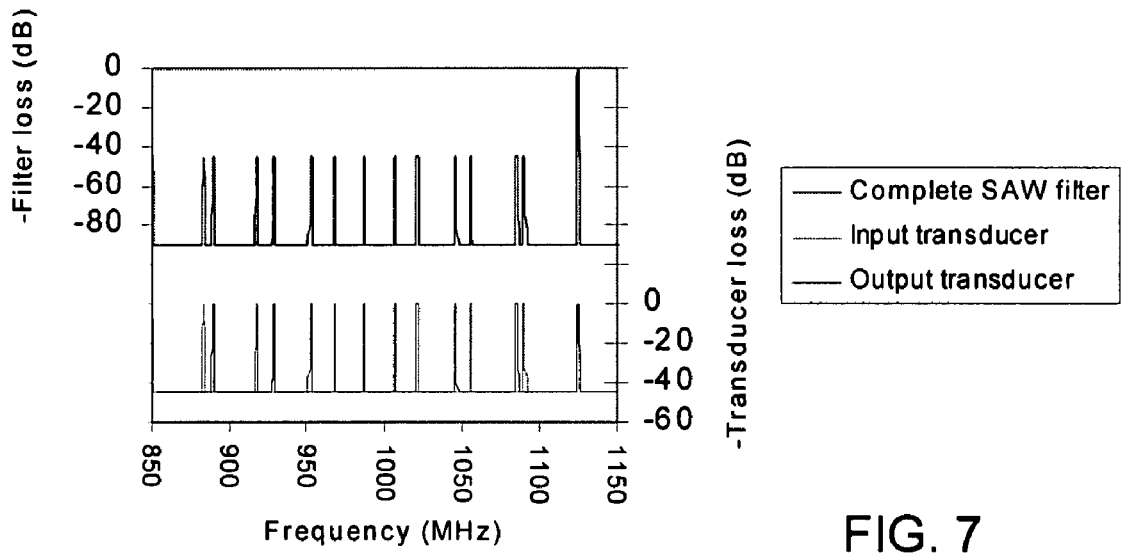
FIG. 7 is a representation of yet another example of the input passbands, output passbands, and overall passband for the implementation of FIG. 1 tuned to 1125 MHz.

Turning to FIG. 6, the input passbands, output passbands, and overall passbands are shown when the SAW filter 102 is tuned to 875 MHz. In this example, the first electrode set 110 adjusts the first voltage bias to increase the velocity through the input portion 122 by 1.7% over the baseline velocity, and the second electrode set 112 adjusts the second voltage bias to decrease the velocity through the output portion 124 by 0.9% of the baseline velocity. As shown in FIG. 6, the set of input passbands 118 and the set of output passbands 120 line up at 875 MHz, but do not line up anywhere else in the range of 850-1150 MHz. Turning to FIG. 7, the SAW filter 102 is adjusted to 1125 MHz with a velocity tuning of the input portion 122 of −1.3%, and of the output portion 124 of +0.7%.

Figure 8:
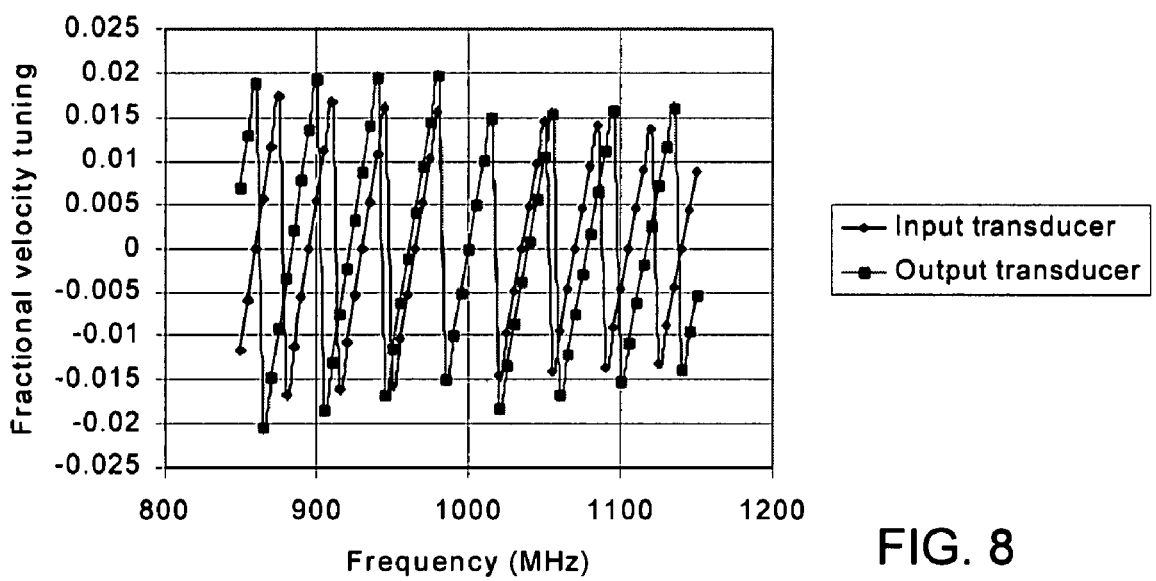
FIG. 8 is a representation of one example of fractional tuning for the implementation of FIG. 1 for a range of desired overall passbands.

Turning to FIG. 8, the fractional velocity tuning for adjustment of the overall passband frequency between 850 and 1150 MHz is shown, with data points every 5 MHz. Any of the frequencies may be selected with velocity tuning of approximately +/−2%. The band of frequencies that can be selected is 300 MHz (850 to 1150 MHz), which is 30% of the center frequency, 1000 MHz. The tuning levels shown in FIG. 8 may be derived by a digital controller responding to a frequency command, or an analog converter that converts a monotonic control voltage. This implementation of the SAW filter 102 advantageously has a high degree of tunability (e.g. 30%) while maintaining a well-shaped, highly selective passband. This implementation of the SAW filter 102 is also continuously tunable. Since a change in the first or second voltage bias can be performed quickly, the passband tuning is very quick (~1 microsecond). In addition, the voltage biasing to modify the velocity does not consume any power, unless the piezoelectric layer 108 leaks charge.

Figure 9:
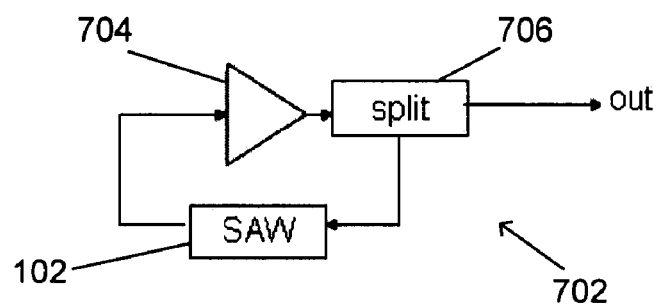
FIG. 9 is a representation of one example of the implementation of FIG. 1 as a feedback loop for a voltage controlled oscillator.

Turning to FIG. 9, a voltage controlled oscillator (VCO) 702 in one example comprises one implementation of the SAW filter 102, an amplifier 704, and a splitter 706. The SAW filter 102 in one example provides narrow, single-mode passbands that can be tuned over a wide frequency range. The VCO 702 is configured to provide low close-in phase noise, since the VCO 702 does not use a varactor, as in previous VCO designs, and the passband frequency is set by the mechanical properties of the SAW filter 102.

The SAW filter 102 is configured to provide a feedback loop for the voltage controlled oscillator 702. The input transducer 104 is coupled with an output of the voltage controlled oscillator, for example, from the splitter 706. The output transducer 106 is coupled with an input of the amplifier 704. The first and second electrode sets are then able to set the passband frequency of the SAW filter 102. The VCO 702 will have the exact phase so that the total feedback loop phase is a multiple of $2\pi$ radians. In one example, a fixed phase shifter is added in the feedback loop to make sure that the SAW filter 102 is operated at its best phase point. If there are multiple frequencies with a total feedback loop phase that is a multiple of $2\pi$ radians, the VCO 702 in one example will oscillate at the frequency which has the minimum loss through the SAW filter 102.

The passband bandwidth and overall wide band of the set of input and output passbands 118 and 120 are based on the overall length and overall weighting of the transducers 104 and 106. The choice of frequency between passband spacing in the two transducers is made to insure overall tunability which meets a practical requirement. The amount of physical tuning, achieved by electrically biasing the material in the acoustic path, that is needed to meet the practical requirement varies primarily with the passband bandwidth (e.g. 5 MHz), and the overall wide band (e.g. 1000-1200 MHz). Assuming the SAW filter 102 must be tunable to be centered on any frequency in the overall wide band and can only provide one single passband forces the designer to adopt certain minimum frequency spacing in the periodic responses of the input and output transducers 104 and 106. If the frequency spacing is large, the result is that a large physical tuning range is needed, since the physical tuning needs to shift the transducer response by about half a frequency spacing at the lowest end of the wide band.

If the frequency spacings are optimized to require the minimum physical material tuning to meet a certain requirement, the result is that this minimum physical tuning increases with both the width of the overall wide band, and with the width of the passband. This is necessary so that any frequency in the overall wide band can be rejected without creating more than one narrow passband. If the frequency spacings are insufficient, unwanted passbands will appear with desired passbands due to accidental alignment of some of the multiple passbands in the transducers 104 and 106. Combinations of a wide specified overall band and a wide passband, can result in a requirement for physical tuning of the material under the transducers which is not practically achievable. If physical tuning of only a few percent is the most possible, the device is limited to relatively narrow passbands and/or relatively narrow overall bands.

Figure 10:
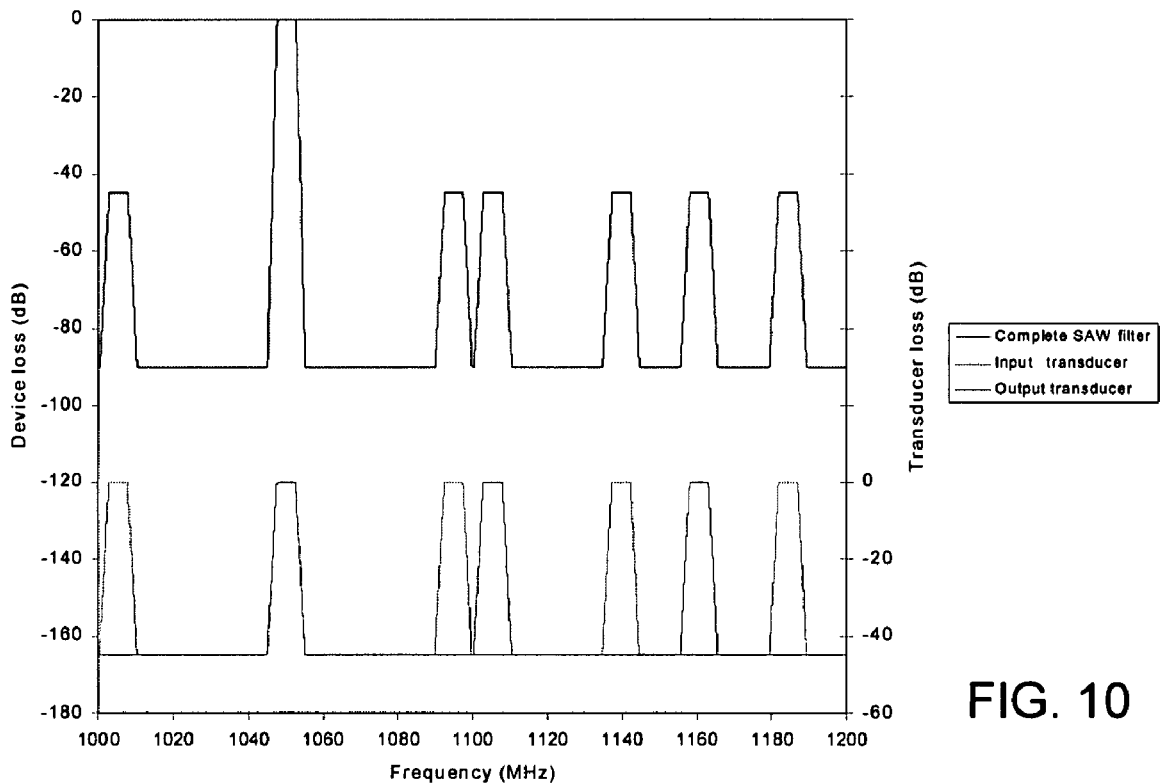
FIG. 10 is a representation of one example of input passbands, output passbands, and an overall passband for another implementation of the apparatus of FIG. 1 tuned to 1050 MHz.
Figure 11:
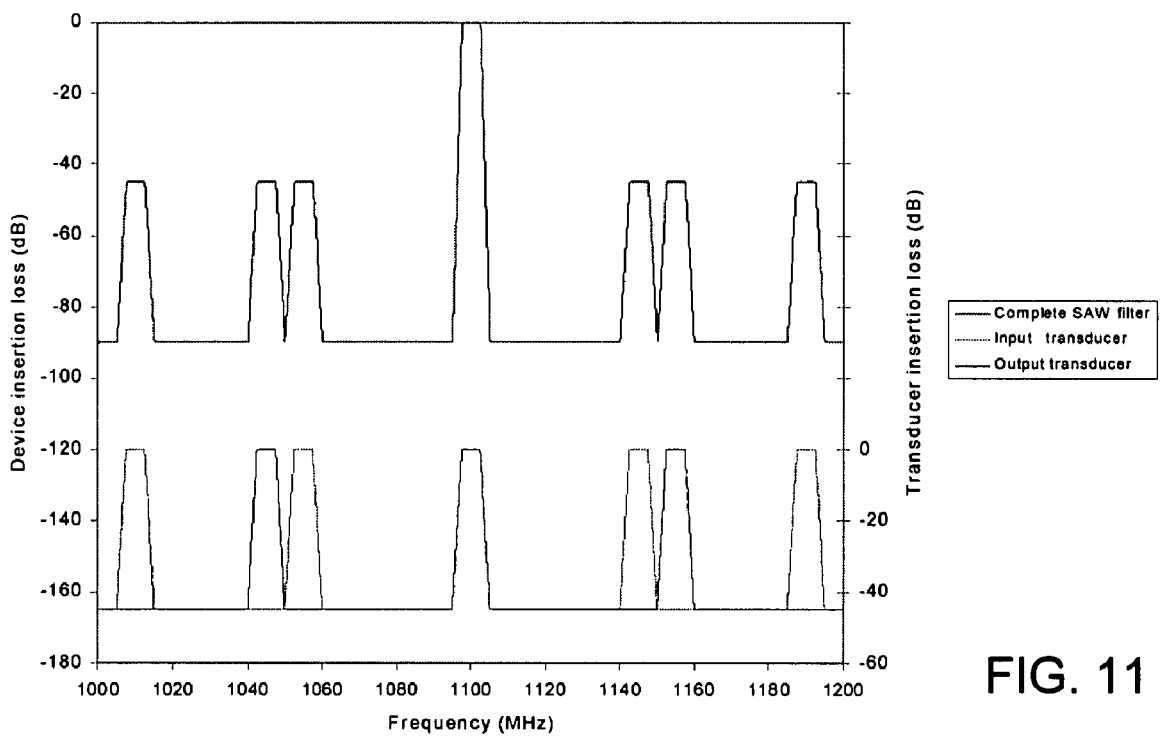
FIG. 11 is a representation of another example of the input passbands, output passbands, and the overall passband for the implementation of FIG. 10 tuned to 1100 MHz.
Figure 12:
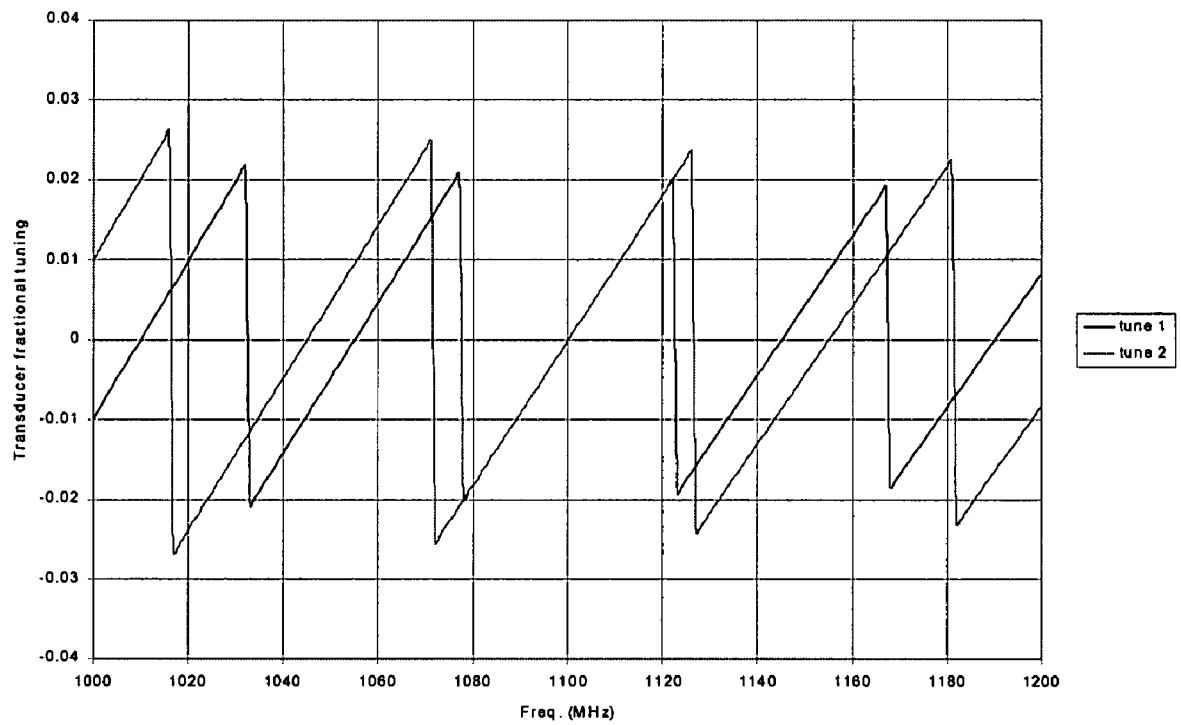
FIG. 12 is a representation of one example of fractional tuning for the implementation of FIG. 10 for a range of desired overall passbands.

Turning to FIGS. 10-12, another implementation of the SAW filter 102 has been designed to provide a tunable 5 MHz passband anywhere between 1000 and 1200 MHz, with no unwanted passbands under any conditions. The passbands in each transducer 104 and 106 of this implementation are assumed to provide 45 dB rejection 5 MHz away from the passband center frequency. The passband spacings in the input and output transducers are 45 and 55 MHz, respectively. The design of FIGS. 10-12 was optimized to require the minimum physical tuning of the material. FIG. 10 shows the frequency response of the filter set at 1050 MHz. FIG. 11 shows the response when the filter is set at 1100 MHz. FIG. 12 shows the physical tuning required to set to any of the frequencies in the overall wide band. FIG. 12 shows that slightly more than +/−2.5% physical tuning is needed to make this implementation functional, which may require relatively high tuning voltages.

Figure 13:
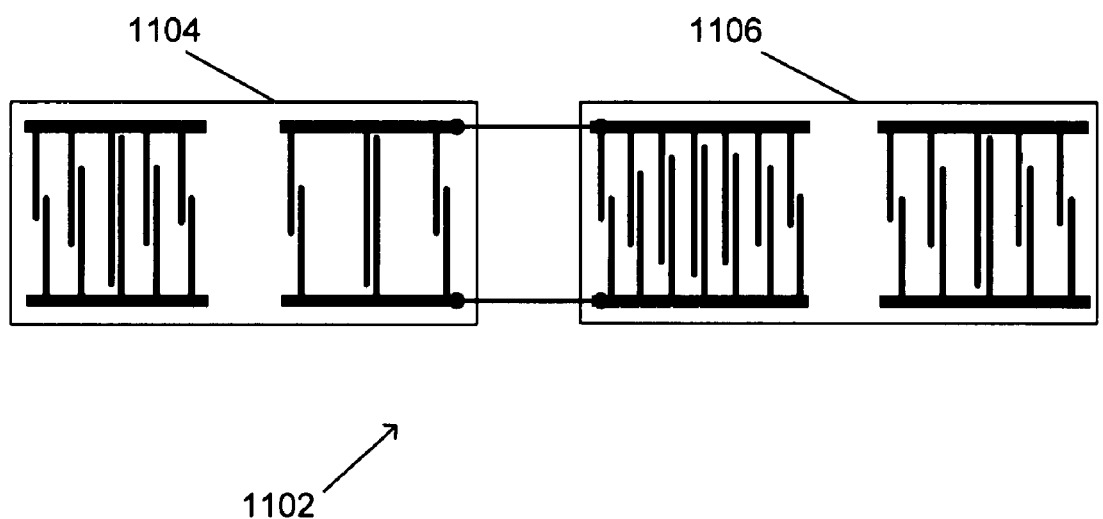
FIG. 13 is a representation of a top view of one implementation of an apparatus that comprises first and second surface acoustic wave filters.

Turning to FIG. 13, a SAW filter 1102 in one example comprises cascaded first and second SAW filters 1104 and 1106. The SAW filters 1104 and 1106 are functionally similar to the SAW filter 102. The input transducer of the SAW filter 1104 comprises an input for the SAW filter 1102. The output transducer of the SAW filter 1104 is coupled with the input transducer of the SAW filter 1106. The output transducer of the SAW filter 1106 comprises an output for the SAW filter 1102. In one example, the input and output transducers 104 and 106 of the first SAW filter 1104 and the input and output transducers 104 and 106 of the second SAW filter 1106 comprise different passband spacings. Accordingly, an input signal to the SAW filter 1102 has four chances to be attenuated by the transducers, which may ease the design requirement on the physical tuning range. With two or more SAW filters cascaded, a number of improvements to the above example are possible:

1. A similar filter can be made with less physical tuning range, resulting in a lower requirement for tuning voltage, or a reduced requirement for piezoelectric material sensitivity to the voltage bias.

2. With the same material and tuning voltage, a filter can be designed with a wider signal bandwidth and/or a wider overall band.

Figure 14:
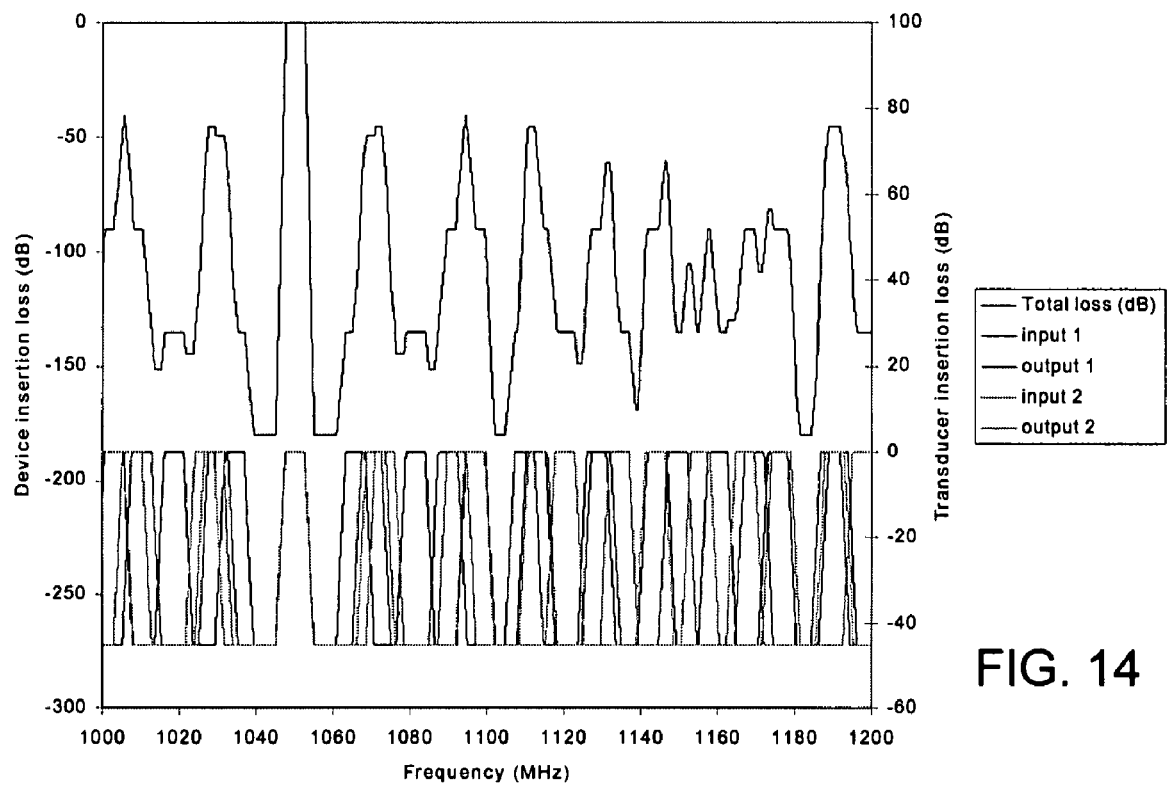
FIG. 14 is a representation of one example of first and second input passbands, first and second output passbands, and an overall passband for the implementation of FIG. 13 tuned to 1050 MHz.
Figure 15:
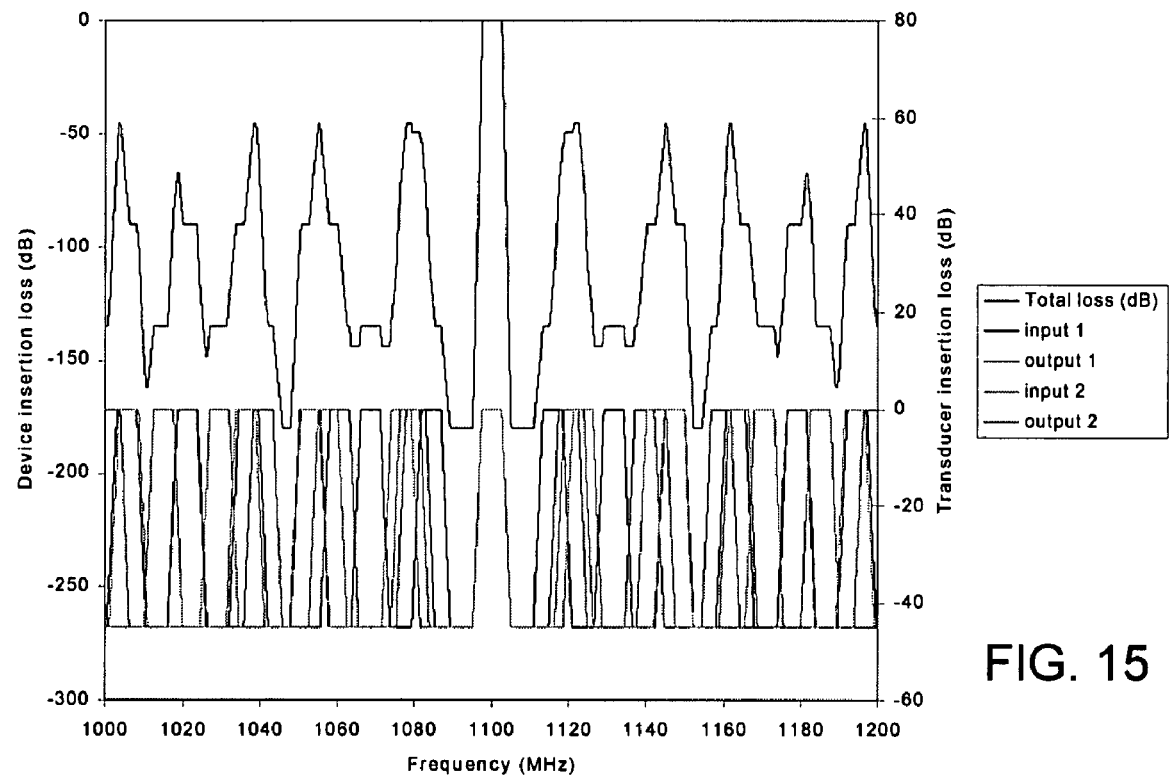
FIG. 15 is a representation of another example of the first and second input passbands, first and second output passbands, and the overall passband for the implementation of FIG. 13 tuned to 1100 MHz.
Figure 16:
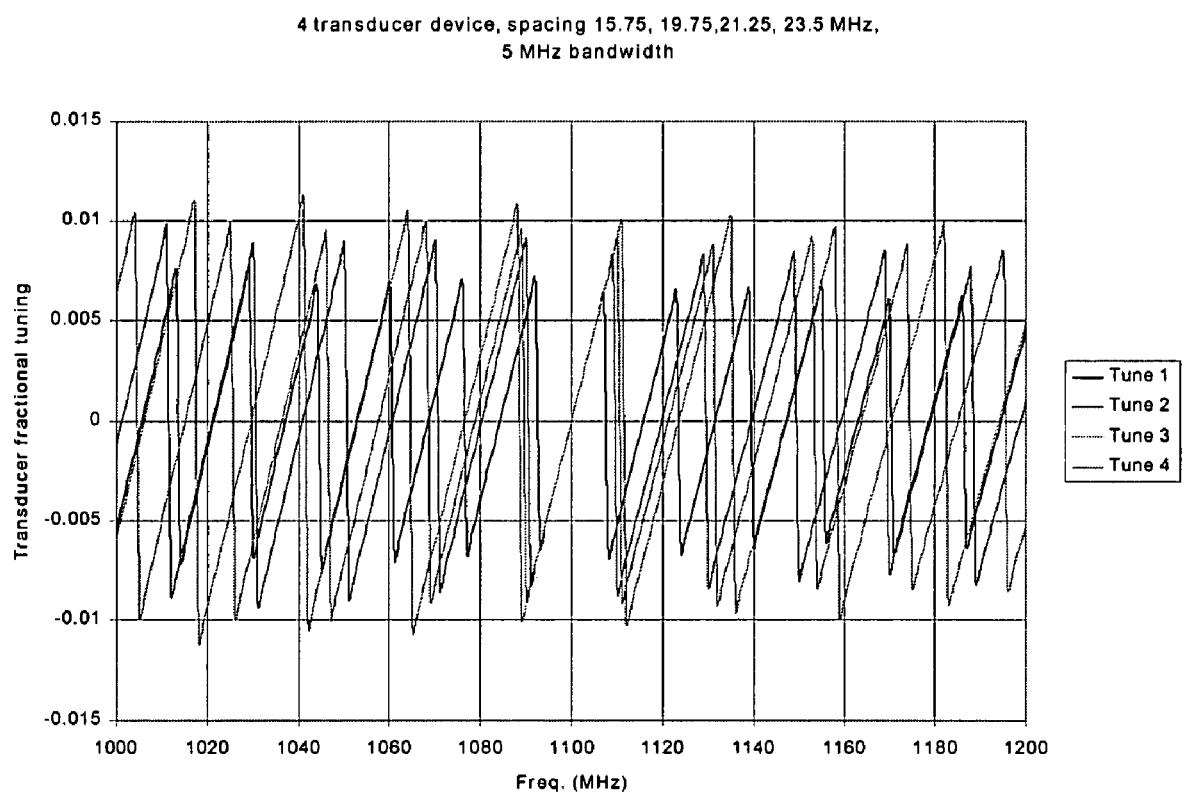
FIG. 16 is a representation of one example of fractional tuning for the implementation of FIG. 13 for a range of desired overall passbands.

Turning to FIGS. 14-16, one example of the filter 1102 comprises two of the SAW filters 102, resulting in four independently tuned transducers, with distinct frequency spacings of 15.75, 19.75, 21.25, and 23.5 MHz. Note that these are less than half of the frequency spacings in the two-transducer design, suggesting that less than half the tuning voltage bias will be required. While the two-transducer filter of FIGS. 10-12 required more than +/−2.5% physical tunability, the cascaded pair of SAW filters 102 of FIGS. 14-16 with the four transducers require only about +/−1% tunability.

Figure 17:
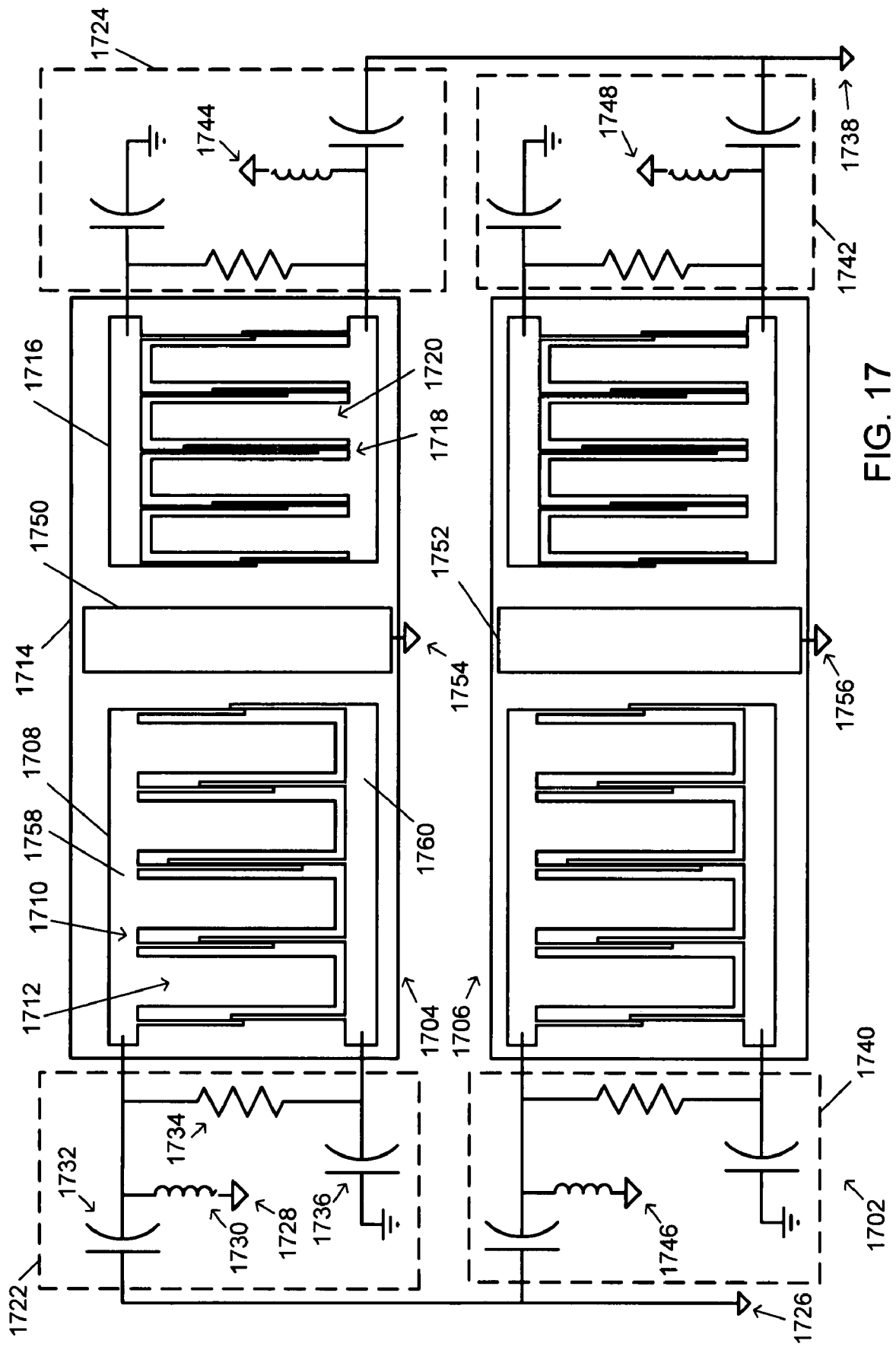
FIG. 17 is a representation of a top view of one implementation of an apparatus that comprises two or more surface acoustic wave filters in parallel.

Turning to FIG. 17, another implementation of the apparatus 100 is shown as a parallel configuration 1702. The parallel configuration 1702 comprises at least two voltage adjustable SAW filters, for example, SAW filters 1704 and 1706. In the implementation of FIG. 17, the SAW filters 1704 and 1706 are identical, but they may be different in alternative implementations. The SAW filter 1704 comprises an input electrode 1708. The input electrode 1708 comprises an input transducer area 1710 and an upper electrode area 1712 which in one example are formed integrally as a single layer on top of a piezoelectric layer 1714. The input transducer area 1710 corresponds to the input transducer 104 and the upper electrode area 1712 corresponds to the upper electrode 126. The SAW filter 1704 further comprises an output electrode 1716 with an output transducer area 1718 and an upper electrode area 1720. The output transducer area 1718 and the upper electrode area 1720 in one example are formed as an integral layer on the piezoelectric layer 1714. Integration of the input transducer area 1710 with the upper electrode area 1712 and integration of the output transducer area 1718 with the upper electrode area 1720 allows for simplified manufacturing of the SAW filter 1704, as will be appreciated by those skilled in the art.

Where the transducer areas 1710 and 1718 are integrated with the upper electrodes 1712 and 1720, respectively, the SAW filter 1704 comprises an input bias network 1722 and an output bias network 1724. The bias network 1722 allows for application of both a voltage bias and an input signal to the input electrode 1708. The bias network 1724 allows for application of a voltage bias to the output electrode 1716 and to receive the output signal. The input signal is applied to input source 1726 and the voltage bias is applied to input 1728. A radio frequency choke 1730 allows the voltage bias, which is a DC signal, to be applied to a first portion 1758 of the input electrode 1708 for biasing the upper electrode area 1712 but isolates the input signal, an RF signal, from the input 1728. The radio frequency choke 1730 in this example comprises an inductor, but may also be a resistor. A coupling capacitor 1732 isolates the voltage bias from the input source 1726 and other outside circuitry. A resistor 1734 across the first portion 1758 and a second portion 1760 of the input electrode 1708 carries the voltage bias to the second portion 1760 of the input electrode 1708 but has sufficiently high resistance (e.g., one mega-ohm) to prevent a short circuit of the input signal. A grounding capacitor 1736 provides an RF ground to the input transducer area 1710 of the input electrode 1708 without causing a short circuit to the voltage bias. The output bias network 1724 in one example comprises a similar configuration to the input bias network 1722 but instead provides an output signal to output sink 1738, as will be appreciated by those skilled in the art.

The SAW filter 1706 in one example comprises an input bias network 1740 and output bias network 1742, analogous to the bias networks 1722 and 1724 of the SAW filter 1704. The inputs and outputs of the SAW filters 1704 and 1706 are coupled at input source 1726 and output sink 1738. In alternative implementations with more than two SAW filters in parallel, the additional SAW filters would also be coupled to the input source 1726 and output sink 1738, as will be appreciated by those skilled in the art.

The parallel configuration 1702 in one example allows for a larger passband bandwidth. For example, if the SAW filters 1704 and 1706 are designed to have passband bandwidths of 5 MHz and overall tuning range from 1000 to 1200 MHz, the SAW filter 1704 may be tuned to a passband spanning 1095 to 1100 MHz and the SAW filter 1706 may be tuned to a passband spanning 1100 to 1105 MHz. This allows for a 10 MHz passband spanning 1095 to 1105 MHz. The input and output bias networks 1722, 1724, 1740, and 1742 comprise inputs 1728, 1744, 1746, and 1748, respectively, for respective voltage biases. As described above, the voltage biases are used to tune the passband frequency of the SAW filters 1704 and 1706 by applying the voltage bias between the upper electrode (e.g., upper electrode areas 1712 and 1720) and lower electrode (not shown).

One or more of the SAW filters of the parallel configuration 1702 in a further example comprise an electrode for phase adjustment of the output signal. In the implementation of FIG. 17, the SAW filter 1704 comprises electrode 1750 and the SAW filter 1706 comprises electrode 1752 for phase adjustment. In alternative implementations, only one of the SAW filters 1704 and 1706 may have an electrode for phase adjustment. The electrodes 1750 and 1752 in one example form voltage adjustable delay lines within the SAW filters 1704 and 1706, respectively. A voltage bias may be applied to the electrodes 1750 and 1752 through inputs 1754 and 1756, respectively, to adjust the velocity of the surface acoustic wave through the SAW filters. The velocity is adjusted such that the output signal from the SAW filter 1704 is in phase (e.g., phase matched) with the output signal from the SAW filter 1706. This allows for a "flat" combined passband response for the parallel configuration 1702. Referring to FIG. 17, the voltage adjustable delay lines are placed between the input and output transducers. In alternative implementations, the voltage adjustable delay lines may be a separate SAW device that is placed in series with the SAW filters, as will be appreciated by those skilled in the art.

The implementation of FIG. 17 may be combined with that of FIG. 13 such that SAW filters are coupled in series as well as in parallel. Referring to FIGS. 1-4 and 17, three separate implementations of the transducer and upper electrode are shown. The first implementation of FIGS. 1-2 shows the transducers 104 and 106 formed as a separate layer on top of the upper electrodes 126 and 130. The second implementation of FIGS. 3-4 shows the upper electrodes 326 and 330 formed on top of the piezoelectric layer 308 and between the finger groups of the transducers 306 and 306. The third implementation of FIG. 17 shows the transducers (e.g., transducer areas 1710 and 1718) formed integrally with the upper electrodes (e.g., upper electrode areas 1712 and 1720) as a single layer on top of the piezoelectric layer 1714. These three implementations may be used interchangeably with appropriate modifications (e.g., the bias networks 1722, 1724, 174, and 1742), as will be appreciated by those skilled in the art.

The apparatus 100 in one example comprises a plurality of components such as one or more of electronic components, hardware components, and computer software components. A number of such components can be combined or divided in the apparatus 100. An example component of the apparatus 100 employs and/or comprises a set and/or series of computer instructions written in or implemented with any of a number of programming languages, as will be appreciated by those skilled in the art.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   a piezoelectric layer;
   an input transducer configured to convert an input signal from an input source to a surface acoustic wave and send the surface acoustic wave from an input portion of the piezoelectric layer to an output portion of the piezoelectric layer, wherein the input transducer comprises a set of input passbands;

an output transducer configured to receive the surface acoustic wave from the output portion of the piezoelectric layer, wherein the output transducer comprises a set of output passbands;
at least one electrode set configured to apply at least one voltage bias to at least one portion of the piezoelectric layer to create an electric field that controls an acoustic velocity of the surface acoustic wave through the at least one portion of the piezoelectric layer;
wherein the at least one electrode set is configured to control one or more of the set of input passbands and the set of output passbands by adjustment of the at least one voltage bias.

2. The apparatus of claim 1, wherein the at least one electrode set comprises:
a first electrode set configured to apply a first voltage bias to the input portion to create a first electric field in the input portion that controls an acoustic velocity of the surface acoustic wave through the input portion, wherein the set of input passbands are based on the acoustic velocity of the surface acoustic wave through the input portion; and
a second electrode set configured to apply a second voltage bias to the output portion to create a second electric field in the output portion that controls an acoustic velocity of the surface acoustic wave through the output portion, wherein the set of output passbands are based on the acoustic velocity of the surface acoustic wave through the output portion;
wherein the first electrode set is configured to control the set of input passbands by adjustment of the first voltage bias;
wherein the second electrode set is configured to control the set of output passbands by adjustment of the second voltage bias.

3. The apparatus of claim 2, wherein the set of input passbands and the set of output passbands overlap at an overall passband;
wherein an adjustment of one or more of the first and second voltage biases causes a change in the overall passband.

4. The apparatus of claim 3, wherein the overall passband comprises only a single passband.

5. The apparatus of claim 3, wherein the input transducer comprises a plurality of linger groups separated center-to-center by a time delay $\tau_{input}$ for the surface acoustic wave at a baseline velocity through the piezoelectric layer;
wherein, when the first voltage bias is equal to zero, the set of input passbands comprise a center passband frequency $f_{input}$, and one or more additional passband frequencies at $f_{input} \pm n^*(1/\tau_{input})$.

6. The apparatus of claim 5, wherein the output transducer comprises a plurality of finger groups separated center-to-center by a time delay $\tau_{output}$ for the surface acoustic wave at the baseline velocity through the piezoelectric layer, wherein $\tau_{input}$ is not equal to $\tau_{output}$;
wherein, when the second voltage bias is equal to zero, the set of output passbands comprise a center passband frequency $f_{output}$ and one or more additional passband frequencies at $f_{output} \pm n^*(1/\tau_{output})$.

7. The apparatus of claim 6, wherein $f_{input}$ is equal to $f_{output}$ when the first voltage bias is equal to zero and the second voltage bias is equal to zero.

8. The apparatus of claim 6, wherein the acoustic velocity of the surface acoustic wave through the input portion is:
equal to the baseline velocity when the first voltage bias is equal to zero,
greater than the baseline velocity for a first polarity of the piezoelectric layer and less than the baseline velocity for a second polarity of the piezoelectric layer when the first voltage bias is positive, and
less than the baseline velocity for the first polarity of the piezoelectric layer and greater than the baseline velocity for the second polarity when the first voltage bias is negative.

9. The apparatus of claim 8, wherein the acoustic velocity of the surface acoustic wave through the output portion is:
equal to the baseline velocity when the second voltage bias is equal to zero,
greater than the baseline velocity for the first polarity of the piezoelectric layer and less than the baseline velocity for the second polarity of the piezoelectric layer when the second voltage bias is positive, and
less than the baseline velocity for the first polarity of the piezoelectric layer and greater than the baseline velocity for the second polarity when the second voltage bias is negative.

10. The apparatus of claim 9, wherein the first electrode set is configured to increase or decrease the first voltage bias to adjust the spacing of the set of input passbands;
wherein the second electrode set is configured to increase or decrease the second voltage bias to adjust the spacing of the set of output passbands.

11. The apparatus of claim 6, wherein the first electrode set comprises an upper electrode and a lower electrode coupled to upper and lower faces of the piezoelectric layer, respectively;
wherein the second electrode set comprises an upper electrode and a lower electrode coupled to the upper and lower faces of the piezoelectric layer, respectively.

12. The apparatus of claim 11, wherein the lower electrode of the first electrode set and the lower electrode of the second electrode set are formed as a single electrode layer.

13. The apparatus of claim 11, wherein the input transducer is formed on the upper electrode of the first electrode set;
wherein the output transducer is formed on the upper electrode of the second electrode set.

14. The apparatus of claim 11, wherein the input transducer and the upper electrode of the first electrode set are formed on the piezoelectric layer such that the upper electrode of the first electrode set is between the finger groups of the input transducer;
wherein the output transducer and the upper electrode of the second electrode set are formed on the piezoelectric layer such that the upper electrode of the second electrode set is between the finger groups of the output transducer.

15. The apparatus of claim 14, wherein the upper electrode of the first electrode set comprises at least one metal pad formed between the finger groups of the input transducer;
wherein the upper electrode of the second electrode set comprises at least one metal pad formed between the finger groups of the output transducer.

16. The apparatus of claim 6, wherein the piezoelectric layer, the input transducer, the output transducer, the first electrode set, and the second electrode set form a first surface acoustic wave (SAW) filter, the apparatus further comprising:
a second SAW filter that comprises an input transducer and an output transducer;
wherein the input transducer of the second SAW filter comprises a set of input passbands based on a time delay $\tau_{input}$;

wherein the output transducer of the second SAW filter comprises a set of output passbands based on a time delay $\tau_{output}$;

wherein the output transducer of the first SAW filter is configured to convert the surface acoustic wave into an output signal and send the output signal to the input transducer of the second SAW filter;

wherein the set of input passbands of the first SAW filter, the set of output passbands of the first SAW filter, a set of input passbands of the second SAW filter, and a set of output passbands of the second SAW filter overlap at the overall passband;

wherein $\tau_{input}$ of the first SAW filter, $\tau_{output}$ of the first SAW filter, $\tau_{input}$ of the second SAW filter, and $\tau_{output}$ of the second SAW filter are not equal.

17. The apparatus of claim 2, further comprising:

a voltage controlled oscillator;

wherein the piezoelectric layer, the input transducer, the output transducer, the first electrode set, and the second electrode set form a surface acoustic wave filter;

wherein the input transducer is coupled with an output of the voltage controlled oscillator and the output transducer is coupled with an input of the voltage controlled oscillator to provide a feedback loop to the amplifier;

wherein the amplifier is configured to output a signal at a frequency of the overall passband;

wherein the first electrode set and the second electrode set are configured to adjust the frequency of the signal by adjusting the overall passband.

18. The apparatus of claim 17, further comprising a fixed phase shifter within the feedback loop that is configured to provide the output of the voltage controlled oscillator at an optimal phase for the surface acoustic wave filter.

19. The apparatus of claim 2, wherein the first transducer and the second transducer comprise thinned electrode transducers.

20. The apparatus of claim 2, wherein the first electrode set comprises an upper electrode that is formed integrally with the input transducer;

wherein the second electrode set comprise an upper electrode that is formed integrally with the output transducer.

21. The apparatus of claim 20, further comprising:

a first radio frequency choke that couples a first portion of the input transducer to a first voltage bias source to receive the first voltage bias and prevent a short circuit of the input signal to the first voltage bias source;

a first resistor that couples the first portion of the input transducer to a second portion of the input transducer to receive the first voltage bias and prevent a short circuit of the input signal;

a first coupling capacitor that couples the input source to the first portion of the input transducer and prevents a short circuit of the first voltage bias to the input source;

a first grounding capacitor that couples the second portion of the input transducer to a first radio frequency ground and prevents a short circuit of the first voltage bias to the first radio frequency ground.

22. The apparatus of claim 21, wherein the output transducer is configured to convert the surface acoustic wave into an output signal and provide the output signal to an output sink;

a second radio frequency choke that couples a first portion of the output transducer to a second voltage bias source to receive the second voltage bias and prevent a short circuit of the output signal to the second voltage bias source;

a second resistor that couples the first portion of the output transducer to a second portion of the output transducer to receive the second voltage bias and prevent a short circuit of the output signal;

a second coupling capacitor that couples an output sink to the first portion of the input transducer and prevents a short circuit of the second voltage bias to the output sink;

a second grounding capacitor that couples the second portion of the output transducer to a second radio frequency ground and prevents a short circuit of the second voltage bias to the second radio frequency ground.

23. The apparatus of claim 1, wherein the piezoelectric layer, the input transducer, the output transducer, and the at least one electrode set form a first surface acoustic wave (SAW) filter that provides a first overall passband;

the apparatus further comprising:

a second surface acoustic wave filter that comprises a piezoelectric layer, an input transducer, an output transducer, and at least one electrode set;

wherein the input transducer of the second SAW filter is coupled to the input source;

wherein the input transducer of the second SAW filter is configured to convert the input signal from the input source to a surface acoustic wave and send the surface acoustic wave from an input portion of the piezoelectric layer of the second SAW filter to an output portion of the piezoelectric layer of the second SAW filter, wherein the input transducer of the second SAW filter comprises a set of input passbands;

wherein the output transducer of the second SAW filter is configured to receive the surface acoustic wave from the output portion of the second SAW filter, wherein the output transducer of the second SAW filter comprises a set of output passbands;

wherein the at least one electrode set of the second SAW filter is configured to apply at least one voltage bias to at least one portion of the piezoelectric layer of the second SAW filter to create an electric field that controls an acoustic velocity of the surface acoustic wave through the at least one portion of the piezoelectric layer of the second SAW filter;

wherein the at least one electrode set of the second SAW filter is configured to control one or more of the set of input passbands and the set of output passbands of the second SAW filter by adjustment of the at least one voltage bias;

wherein the set of input passband and the set of output passbands of the second SAW filter overlap at a second overall passband;

wherein the output transducer of the first SAW filter is coupled to an output sink and provides a first output signal to the output sink;

wherein the output transducer of the second SAW filter is coupled to the output sink and provides a second output signal to the output sink;

wherein the first overall passband and of the first SAW filter and the second overall passband of the second SAW filter form a third overall passband at the output sink that is larger than the first or second overall passbands.

24. The apparatus of claim 23, wherein at least one of the first SAW filter and the second SAW filter comprise a voltage adjustable delay line to phase match an output signal from the first SAW filter with an output signal from the second SAW filter.

25. A method, comprising the steps of:

applying a first voltage bias to an input portion of a piezoelectric layer to create a first electric field in the input portion, wherein the first electric field controls a velocity of a surface acoustic wave through the input portion;

introducing an input signal as a surface acoustic wave to the input portion and toward an output portion of the piezoelectric layer by an input transducer coupled with the input portion, wherein the input transducer comprises a set of input passbands that are based on the velocity of the surface acoustic wave through the input portion;

attenuating the input signal by the input transducer if a frequency of the input signal is not within the set of input passbands;

applying a second voltage bias to the output portion to create a second electric field in the output portion, wherein the second electric field controls the velocity of the surface acoustic wave through the output portion;

converting the surface acoustic wave to an output signal by an output transducer coupled with the output portion, wherein the output transducer comprises a set of output passbands that are based on the velocity of the surface acoustic wave through the output portion; and attenuating the output signal by the output transducer if the frequency of the output signal is not within the set of output passbands.

26. The method of claim 25, wherein the step of applying the first voltage to the input portion of the piezoelectric layer to create the first electric field in the input portion comprises one of:

increasing the first voltage bias for a first polarity of the piezoelectric layer or reducing the first voltage bias for a second polarity of the piezoelectric layer to increase the velocity of the surface acoustic wave through the input portion to upshift, and increase the spacing between, the set of input passbands; and reducing the first voltage bias for the first polarity of the piezoelectric layer or increasing the first voltage bias for the second polarity of the piezoelectric layer to reduce the velocity of the surface acoustic wave through the input portion to downshift, and reduce the spacing between, the set of input passbands;

wherein the step of applying the second voltage to the output portion of the piezoelectric layer to create the second electric field in the output portion comprises one of:

increasing the second voltage bias for the first polarity of the piezoelectric layer or reducing the second voltage bias for the second polarity of the piezoelectric layer to increase the velocity of the surface acoustic wave through the output portion to upshift, and increase the spacing between, the set of output passbands; and reducing the second voltage bias for the first polarity of the piezoelectric layer or increasing the second voltage bias for the second polarity of the piezoelectric layer to reduce the velocity of the surface acoustic wave through the output portion to downshift, and reduce the spacing between, the set of output passbands.

27. The method of claim 25, further comprising the step of:
selecting the first voltage bias and the second voltage bias such that the set of input passbands and the set of output passbands overlap at only a single desired passband.

28. The method of claim 27, wherein the step of introducing the input signal as the surface acoustic wave to the input portion and toward the output portion of the piezoelectric layer by the input transducer coupled with the input portion comprises the steps of:
receiving the input signal from an output of amplifier of a voltage controlled oscillator; and
sending the output signal from the output transducer to an input of the amplifier;
wherein the step of selecting the first voltage bias and the second voltage bias such that the set of input passbands and the set of output passbands overlap at only the single desired passband comprises the step of:
selecting the first voltage bias and the second voltage bias such that the single desired passband comprises a desired output frequency of the voltage controlled oscillator.

29. The method of claim 27, wherein the piezoelectric layer, the input transducer, the output transducer, the first electrode set, and the second electrode set form a first surface acoustic wave (SAW) filter, the method further comprising the step of:
applying a third voltage bias to an input portion of a second SAW filter to create a third electric field in the input portion of the second SAW filter, wherein the third electric field controls a velocity of a surface acoustic wave through the input portion of the second SAW filter;
wherein the step of attenuating the input signal by the output transducer if the frequency of the input signal is not within the set of output passbands comprises the step of:
attenuating the input signal by the output transducer of the first SAW filter if the frequency of the input signal is not within the set of output passbands of the output transducer of the first SAW filter;
the method further comprising the steps of:
coupling the output signal from the output transducer of the first SAW filter to an input transducer of the second SAW filter;
introducing the output signal as a second surface acoustic wave to the input portion of a piezoelectric layer of the second SAW filter and toward an output portion of the piezoelectric layer of the second SAW filter by the input transducer of the second SAW filter, wherein the input transducer of the second SAW filter comprises a set of input passbands that are based on the velocity of the second surface acoustic wave through the input portion of the second SAW filter;
attenuating the output signal by the input transducer of the second SAW filter if a frequency of the output signal is not within the set of input passbands of the input transducer of the second SAW filter;
applying a fourth voltage bias to an output portion of the piezoelectric layer of the second SAW filter to create a fourth electric field in the output portion of the second SAW filter, wherein the fourth electric field controls the velocity of the second surface acoustic wave through the output portion of the second SAW filter;
converting the second surface acoustic wave to a second output signal by an output transducer coupled with the output portion of the second SAW filter, wherein the output transducer of the second SAW filter comprises a set of output passbands that are based on the velocity of the second surface acoustic wave through the output portion of the second SAW filter; and
attenuating the second output signal by the output transducer of the second SAW filter if the frequency of the second output signal is not within the set of output passbands of the second SAW filter.

30. The method of claim 29, wherein the step of selecting the first voltage bias and the second voltage bias such that the set of input passbands and the set of output passbands overlap at only the single desired passband comprises the step of:

selecting the first voltage bias, the second voltage bias, the third voltage bias, and the fourth voltage bias such that the set of input passbands of the first SAW filter, the set of output passbands of the first SAW filter, the set of input passbands of the second SAW filter, and the set of output passbands of the second SAW filter overlap at only the single desired passband.

31. A method, comprising the steps of:

coupling an output of a first SAW filter to an input of a second SAW filter;

applying a first voltage bias to an input piezoelectric portion of the first SAW filter to adjust a first set of passbands of an input transducer of the first SAW filter;

applying a second voltage bias to an output piezoelectric portion of the first SAW filter to adjust a second set of passbands of an output transducer of the first SAW filter;

applying a third voltage bias to an input piezoelectric portion of the second SAW filter to adjust a third set of passbands of an input transducer of the second SAW filter;

applying a fourth voltage bias to an output piezoelectric portion of the second SAW filter to adjust a fourth set of passband of an output transducer of the second SAW filter; and adjusting the first, second, third, and fourth voltage biases such that the first, second, third, and fourth sets of passbands overlap at only a single desired passband.

32. The method of claim 31, further comprising the steps of:

selecting the first SAW filter and the second SAW filter such that a frequency spacing for each of the input transducer of the first SAW filter, the output transducer of the first SAW filter, the input transducer of the second SAW filter, and the output transducer of the second SAW filter are not equal.

33. A method for forming a voltage adjustable surface acoustic wave filter, comprising the steps of:

forming an electrode layer on a substrate;

forming a piezoelectric layer on the electrode layer;

forming an input transducer and at least one first electrode on the piezoelectric layer;

forming an output transducer and at least one second electrode on the piezoelectric layer.

34. The method of claim 33, wherein the step of forming the input transducer and the at least one first electrode on the piezoelectric layer comprises the step of:

forming the at least one first electrode between finger groups of the input transducer.

35. The method of claim 34, wherein the step of forming the at least one first electrode between the finger groups of the input transducer comprises the step of:

forming the at least one first electrode and the input transducer as an integral layer on top of the piezoelectric layer.

36. The method of claim 33, wherein the step of forming the output transducer and the at least one second electrode on the piezoelectric layer comprises the step of:

forming the at least one second electrode between finger groups of the output transducer.

37. The method of claim 36, wherein the step of forming the at least one second electrode between the finger groups of the output transducer comprises the step of:

forming the at least one second electrode and the output transducer as an integral layer on top of the piezoelectric layer.

38. A method, comprising the steps of:

coupling an input of a first voltage adjustable surface acoustic wave (SAW) filter with an input of a second voltage adjustable SAW filter, wherein the first SAW filter comprises a first passband and the second SAW filter comprises a second passband;

coupling an output of the first voltage adjustable SAW filter with an output of the second voltage adjustable SAW filter to provide an overall passband between the inputs and outputs of the first and second voltage adjustable SAW filters;

adjusting at least one voltage bias applied to at least one of the first voltage adjustable SAW filter and the second voltage adjustable SAW filter to adjust the overall passband of the first and second voltage adjustable SAW filters.

39. The method of claim 38, further comprising the step of:

coupling at least one delay line in series with at least one of the first and second voltage adjustable SAW filters;

adjusting at least one voltage bias applied to the at least one delay line to phase match an output signal from the first voltage adjustable SAW filter with an output signal from the second voltage adjustable SAW filter.

\* \* \* \* \*